(12) United States Patent
Buhler et al.

(10) Patent No.: US 6,433,272 B1
(45) Date of Patent: Aug. 13, 2002

(54) CROSSTALK REDUCTION IN CONSTRAINED WIRING ASSEMBLIES

(75) Inventors: Otto Richard Buhler, Boulder; Charles Grasso, Louisville, both of CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 09/666,011

(22) Filed: Sep. 19, 2000

(51) Int. Cl.$^7$ ................................................ H01B 7/00
(52) U.S. Cl. ...................................................... 174/27
(58) Field of Search ......................... 174/27, 28, 113 R, 174/117 F, 117 FF, 261

(56) References Cited

U.S. PATENT DOCUMENTS

| | | | | |
|---|---|---|---|---|
| 3,757,028 A | * | 9/1973 | Schlessel | 174/33 |
| 3,761,842 A | * | 9/1973 | Gandrud | 333/1 |
| 3,764,727 A | * | 10/1973 | Balde | 174/34 |
| 4,202,550 A | * | 5/1980 | Morinaga | 274/23 R |
| 4,266,399 A | | 5/1981 | Ellis, Jr. | 57/293 |
| 4,413,469 A | | 11/1983 | Paquin | 57/293 |
| 4,712,368 A | | 12/1987 | Garner | 57/314 |
| 4,873,393 A | | 10/1989 | Friesen et al. | 174/34 |
| 4,945,189 A | * | 7/1990 | Palmer | 174/32 |
| 5,039,824 A | * | 8/1991 | Takashima et al. | 174/33 |
| 5,109,185 A | | 4/1992 | Ball | 323/207 |
| 5,237,809 A | | 8/1993 | Oestreich et al. | 57/293 |
| 5,350,324 A | | 9/1994 | Guilbert | 439/894 |
| 5,357,050 A | * | 10/1994 | Baran et al. | 174/33 |
| 5,397,862 A | * | 3/1995 | Bockelman et al. | 174/33 |
| 5,435,752 A | | 7/1995 | Siemon et al. | 439/620 |
| 5,504,273 A | * | 4/1996 | Nakanishi | 174/34 |
| 5,647,195 A | | 7/1997 | Josoff | 57/67 |
| 5,700,167 A | | 12/1997 | Pharney et al. | 439/676 |
| 5,791,943 A | | 8/1998 | Lo et al. | 439/373 |
| 5,931,703 A | | 8/1999 | Aekins | 439/676 |
| 5,939,952 A | * | 8/1999 | Noda et al. | 333/1 |
| 5,965,956 A | * | 10/1999 | Bochme et al. | 307/91 |
| 6,013,874 A | * | 1/2000 | Gwiazdowski | 174/36 |
| 6,017,240 A | | 1/2000 | Belopolsky et al. | 439/676 |
| 6,017,247 A | | 1/2000 | Gwiazdowski | 439/257 |
| 6,042,427 A | | 3/2000 | Adriaenssens et al. | 439/676 |
| 6,052,891 A | | 4/2000 | Kumpf | 29/745 |
| 6,057,512 A | * | 5/2000 | Noda et al. | 174/250 |
| 6,224,395 B1 | * | 5/2001 | Dahlen et al. | 439/67 |

FOREIGN PATENT DOCUMENTS

| | | | | |
|---|---|---|---|---|
| EP | 0 692 884 | | 1/1996 | |
| JP | 6-349344 A | * | 12/1994 | H01B/11/04 |

* cited by examiner

Primary Examiner—Dean A. Reichard
Assistant Examiner—William H. Mayo, III
(74) Attorney, Agent, or Firm—Carstens, Yee & Cahoon L.L.P.

(57) ABSTRACT

A wiring apparatus for reducing electromagnetic interference between conductive wires is provided. Wire pairs are incorporated into rigid or flexible printed circuits to precisely control loop alignment and phase differences. This precise alignment helps to cancel radiated electromagnetic fields and reduce voltage polarities induced in nearby wires. In one embodiment, a pair of parallel wires is aligned parallel to a second, twisted pair of wires. In another embodiment, two twisted pairs of wires, with identical loop lengths, are aligned parallel to each other and offset by exactly one half loop length. In a third embodiment, two twisted pairs of wires are aligned parallel to each other, in which one pair has a loop length that is an integer ratio of the other pair.

11 Claims, 3 Drawing Sheets

CROSSTALK REDUCTION IN CONSTRAINED WIRING ASSEMBLIES

BACKGROUND OF THE INVENTION

1. Technical Field

The present invention relates to reducing electromagnetic interference between conducting wires in close proximity to each other.

2. Description of Related Art

A common problem encountered in the use of conductive wiring for communications is the phenomenon of crosstalk. Crosstalk refers to electromagnetic interference between wires in close proximity to each other, resulting in degradation of signal quality. To reduce crosstalk, the wires must be arranged so that their respective electromagnetic fields cancel each other and produce a reduced composite radiation pattern.

A well-known method for reducing electromagnetic interference (including crosstalk) is twisted pair wiring. The twisting of the paired wires places their respective electromagnetic fields out of phase with each other. This phase difference causes the two fields to partially cancel each other, thereby reducing the composite field, and hence, crosstalk with other wires in the vicinity.

After twisted pairing, the next step, usually, is to take several twisted pairs of wire and twist them together into groups, and then twist the groups into a round cable. To reduce crosstalk between the pairs, a variety of lays (length of twist) are used for each pair to produce random conductor orientation. This random orientation places the electromagnetic field of each pair out of phase with the others, thereby reducing, but not eliminating, the possibility that one pair will interfere with another pair.

Though the random orientation caused by different twisting lengths is very useful in reducing crosstalk between twisted pairs, it does have its limitations. The phase differences between the different electromagnetic fields will usually result in destructive interference, reducing the strength of the composite field. In some cases, the random orientation may cause complete destructive interference, thereby eliminating all crosstalk. However, the randomness can work in the other direction and produce constructive interference, which will strengthen the composite electromagnetic field and exacerbate crosstalk.

The lack of control in random orientation limits the degree to which the composite electromagnetic fields, and resulting crosstalk, can be reduced. Therefore, a method for reducing crosstalk more precisely and effectively than random conductor orientation is desirable.

SUMMARY OF THE INVENTION

The present invention provides a wiring apparatus for reducing electromagnetic interference between conductive wires. Wire pairs are incorporated into rigid or flexible printed circuits to precisely control loop alignment and phase differences. This precise alignment helps to cancel radiated electromagnetic fields and reduce voltage polarities induced in nearby wires.

In one embodiment, a pair of parallel wires is aligned parallel to a second, twisted pair of wires. In another embodiment, two twisted pairs of wires, with identical loop lengths, are aligned parallel to each other and offset by exactly one half loop length. In a third embodiment, two twisted pairs of wires are aligned parallel to each other, in which one pair has a loop length that is an integer ratio of the other pair.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
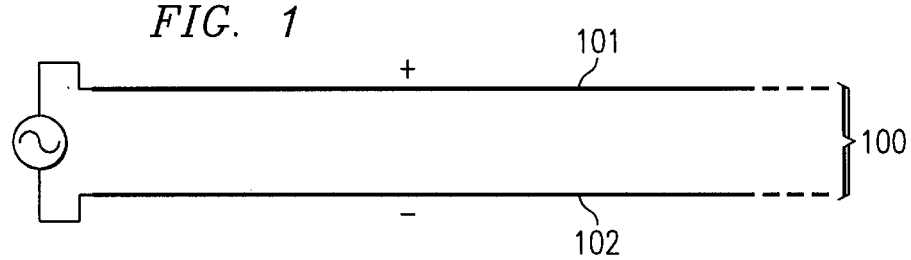
FIG. 1 depicts a schematic diagram of parallel conductive wires carrying an electric current.

Referring to FIG. 1, a schematic diagram illustrating a pair 100 of parallel wires 101 and 102 carrying an electrical current is depicted. This simple arrangement is the conceptual starting point for both the prior art and the present invention. As the current passes through the wire pair 100, the charge polarity between wires 101 and 102 will alternate. FIG. 1 illustrates an instant in time when wire 101 has a positive charge and wire 102 has a negative charge. wires 101 and 102 each generate an electromagnetic field as the electric current passes through them. These electromagnetic fields can induce voltages in other conductive wires near wire pair 100, resulting in interference with signal transmission in these other wires. This electromagnetic interference is known as crosstalk.

Figure 2A:
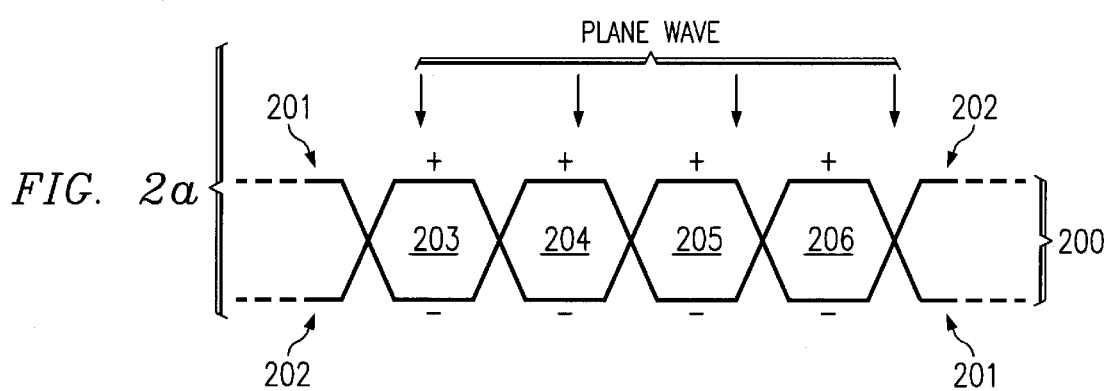
FIGS. 2(a), 2(b) and 2(c) depict schematic diagrams illustrating the general principle of twisted wiring to reduce electromagnetic interference.
Figure 2B:
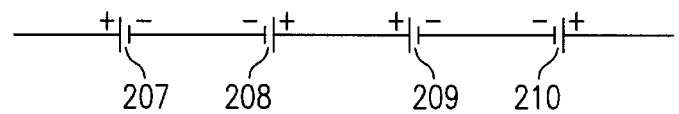
Figure 2C:
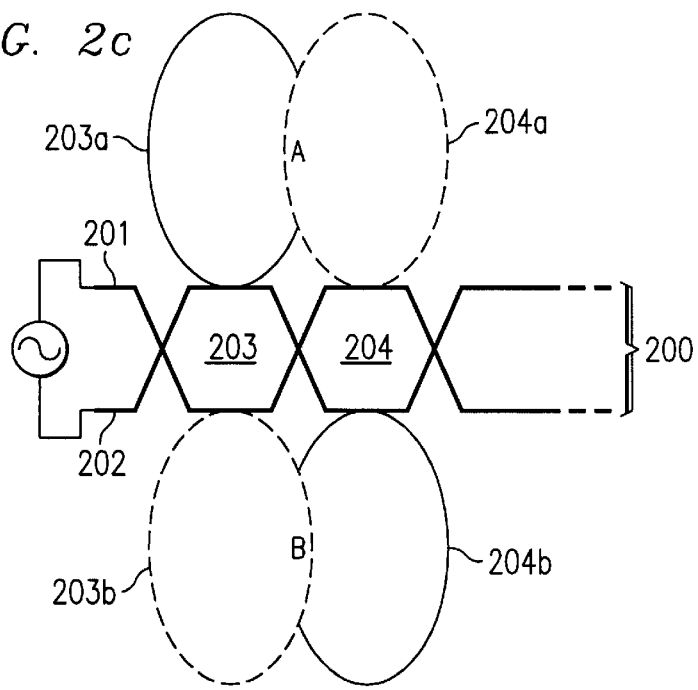

Referring now to FIGS. 2(a), 2(b), and 2(c) schematic diagrams illustrating the general principle of twisted wiring for reducing electromagnetic interference are depicted. Twisted wiring not only forms the basis for much of the prior art, it is also the starting point for the present invention.

FIG. 2(a) depicts an electric current passing through a twisted pair 200 of wires 201 and 202. At the particular instant illustrated in FIG. 2(a), the top of each loop 203–206 has a positive charge and the bottom conductor of each loop 203–206 has a negative charge, as indicated. Assuming that the lengths and areas of each loop 203–204 are equal, the total voltage in each loop will be equal.

FIG. 2(b) depicts loops 203–206 as a series of batteries 207–210. This depiction illustrates how the voltage polarities in loops 203–206 cancel each other due to the twists in wire pair 200. Functionally, loops 203–206 and batteries 207–210 are equivalent, but the battery format allows clearer illustration. The left side of each battery 207–210 represents the charge on wire 202, and the right side represents the charge on wire 201. Due to the twists in wire pair 200, the polarity alternates from one battery to the next. Hence, each pair of successive batteries, such as 207 and 208 for example, will cancel each other's polarity (again, assuming that loops 203–206 all have equal length and area). Therefore, for an even number of loops, the net voltage polarity in wire pair 200 will be zero. If the number of loops is high and odd, the net voltage polarity will be low, but not zero.

FIG. 2(c) depicts the electromagnetic fields generated by loops 203 and 204, which are represented by the antenna patterns 203a, 203b, 204a, and 204b. For both the top lobes 203a and 204a, as well as the bottom lobes 203b and 204b, there are regions of overlap A and B, respectively. Because of the twists in wire pair 200, loops 203 and 204 radiate fields that are 180 degrees out of phase with each other, which is represented by the dashed and solid lines. Due to the opposite phase difference, the regions of overlap A and B become areas of destructive interference, in which the fields cancel each other. The amount of overlap (and cancellation) between the respective fields increases with distance from loops 203 and 204. The net result of the phase difference between the radiated fields is a greatly reduced composite radiation pattern and reduced electromagnetic interference with other wires. However, there are limitations to using twisted pairs for reducing electromagnetic interference.

Figure 3A:
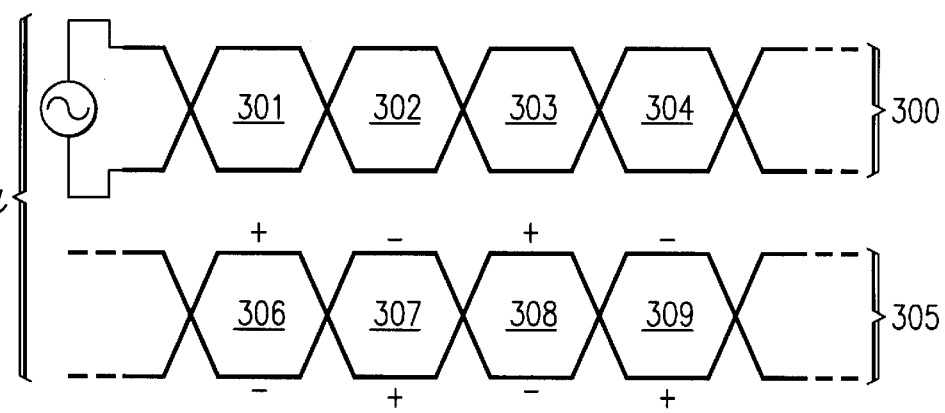
FIGS. 3(a) and 3(b) depict schematic diagrams illustrating crosstalk between twisted wire pairs.

With reference to FIG. 3(a), a schematic diagram illustrating the general problem of electromagnetic interference between twisted pairs is depicted. It is toward this problem that both the prior art and the present invention are directed. In this example, two twisted pairs 300 and 305 are placed parallel to each other. Their respective loops 301–304 and 306–309 are of equal length and area and are aligned. At far distances from the driving loops 301–304, the net radiated field will be close to zero, causing minimal electromagnetic interference with loops 306–309. This is due to the cancellation effect discussed in reference to FIG. 2(c). However, at close distances there is less cancellation of the radiated field from loops 301–304, and the driven loops 306–309 will have voltage polarities induced in them. Because the twisting of wire pair 300 causes the phase of its net radiated field to alternate from loop to loop, as discussed in FIG. 2(c), the induced voltage polarities in twisted pair 305 will alternate from loop to loop, as illustrated in FIG. 3(a).

Figure 3B:
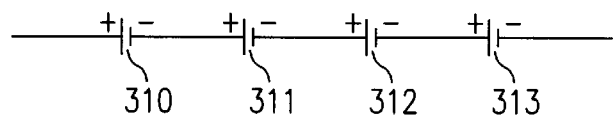

FIG. 3(b) depicts loops 306–309 as a series of batteries 310–313, similar to FIG. 2(b). Since loops 306–309 have alternating polarities, batteries 310–313 do not have alternating polarities, because of the twists in wire pair 305. As a result, batteries 310–313 form an aiding series, in which their respective polarities reinforce each other, rather than cancel each other. The end result is a large induced voltage in twisted pair 305.

The traditional solution for electromagnetic interference between adjacent twisted pairs has been to use random loop lengths and starting positions for the different twisted pairs. Random conductor orientation seeks to throw the loops of adjacent twisted pairs out of phase with each other. This results in greater cancellation of radiated fields and induced voltages, and thus, less interference and crosstalk. However, the lack of control in random orientation limits the degree to which the electromagnetic fields, and resulting interference, can be reduced. Furthermore, random orientation leaves open the possibility that radiated fields may overlap while in phase, thus strengthening the composite field and increasing electromagnetic interference.

The present invention relies on the constraining capabilities of rigid printed and flexible printed wiring to eliminate randomness and further reduce crosstalk. Flexible and rigid circuits allow conductive wires to be held in precise alignment with respect to each other, whether the wires are straight or curving. This allows several approaches for reducing crosstalk.

Figure 4:
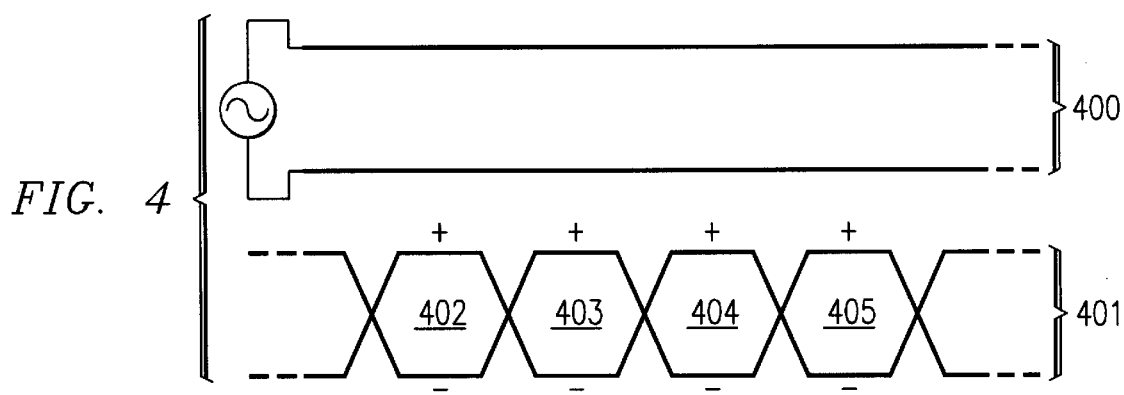
FIG. 4 depicts a schematic diagram illustrating a method for simple crosstalk reduction.

Referring now to FIG. 4, a schematic diagram illustrating simple crosstalk reduction is depicted in accordance with the present invention. If only two wire pairs are involved, the simplest scheme is to twist one pair and leave the other pair untwisted. Because wire pair 400 is not twisted, loops 402–405 will all have the same induced voltage polarity, as illustrated. This results in twisted pair 401 having a net induced voltage polarity of zero, similar to twisted pair 200 in FIG. 2(a). However, while this approach effectively controls crosstalk between wire pairs 400 and 401, there is no reduction in the radiated field produced by wire pair 400, which may be a problem for other wiring in close proximity. In addition, wire pair 400 is susceptible to pickup from other fields in the area. For some applications this may be good enough. For multiple pairs, it may suffice to alternate between twisted and untwisted pairs, the idea being to increase the distance between offending pairs since the strength of electromagnetic fields diminishes with increasing distance.

Figure 5:
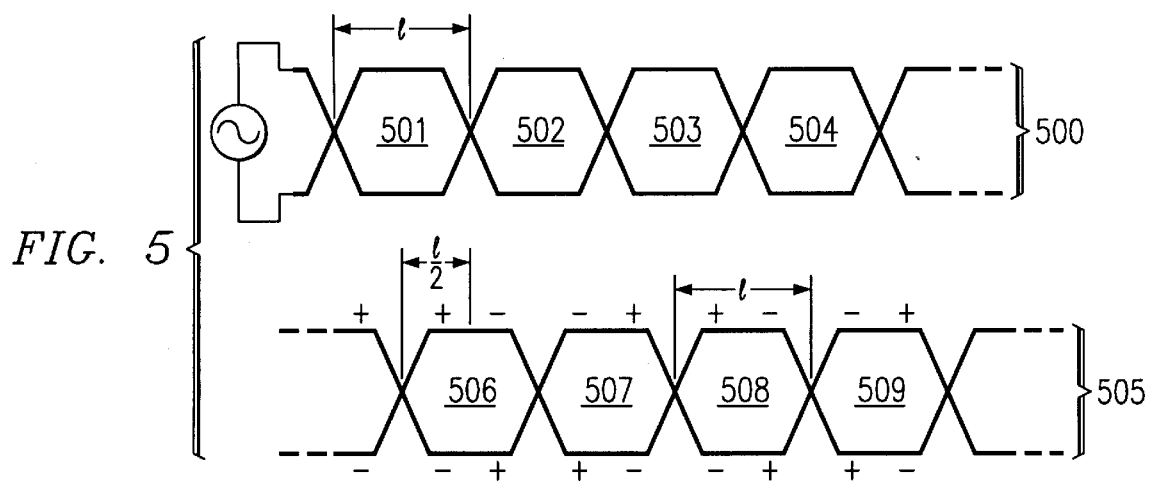
FIG. 5 depicts a schematic diagram illustrating the method of phase control for crosstalk reduction.

In reference to FIG. 5, a schematic diagram illustrating a phase control method for reducing crosstalk is depicted in accordance with the present invention. The length and area of loops 501–504 and 506–509 are identical, similar to FIG. 3(a). However, in this embodiment, loops 501–504 are offset from loops 506–509 by one half loop. Rather than inducing voltage polarities which alternate from one loop to the next, the phase difference caused by the offset alignment induces alternating voltage polarities on each individual loop 506–509, as shown in FIG. 5. As a result, the induced voltage polarities are cancelled within each loop 506–509, rather than being cancelled between loops as was the case in wire pair 200. Each individual loop 506–509 has a net induced voltage polarity of zero. This phase control approach has an advantage over the embodiment in FIG. 4 because its driving wire pair 500 is twisted and has a reduced radiated field, unlike wire pair 400.

Figure 6:
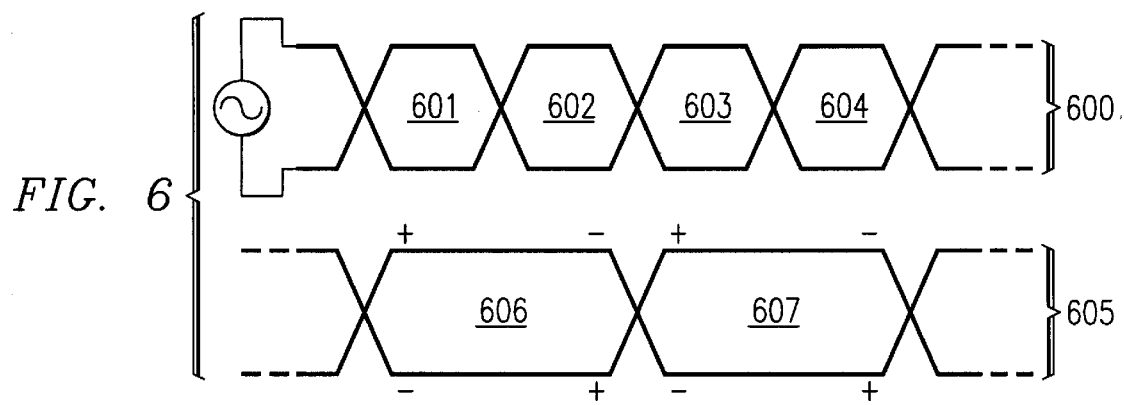
FIG. 6 depicts a schematic diagram illustrating the method of loop ratio control for crosstalk reduction.

With reference to FIG. 6, a schematic diagram illustrating loop ratio control for reducing crosstalk is depicted in accordance with the present invention. In this embodiment of the invention, the loops in each twisted pair are aligned, but the number of loops in one pair of wires is an integer ratio of the loops in another pair. For the example in FIG. 6, the first twisted pair 600 has twice the number of loops as the second twisted pair 605. The two-to-one loop ratio illustrated in FIG. 6 produces alternating voltage polarities on each individual loop 606 and 607, similar to the phase control method depicted in FIG. 5. Again, just as in FIG. 5, this results in each individual loop 606 and 607 having a net induced voltage polarity of zero.

An even loop ratio produces the greatest reduction in crosstalk. In the example of FIG. 6, an even loop ratio causes the induced voltage polarities to be cancelled within each individual loop 606 and 607. However, an odd loop ratio would result in each loop 606 and 607 having a residual voltage polarity, similar to wire pair 200. Therefore, an odd loop ratio would require wire pair 605 to have an even number of loops in order to produce maximum crosstalk reduction.

Though the three methods of the present invention utilize different approaches, they are not mutually exclusive. In a real wiring system, some combination of the embodiments depicted in FIGS. 4, 5, and 6 might be used to diminish electromagnetic interference, including crosstalk.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A wiring apparatus for reducing electromagnetic interference between conductive wires, comprising:
    a first, substantially parallel pair of wires; and
    a second, twisted pair of wires, running substantially parallel to the first, substantially parallel pair of wires.

2. The apparatus according to claim 1, wherein the first, substantially parallel pair of wires, and the second, twisted pair of wires, are part of a flexible printed circuit.

3. The apparatus according to claim 1, wherein the first, substantially parallel pair of wires, and the second, twisted pair of wires, are part of a rigid printed circuit.

4. The apparatus according to claim 1, wherein the first, substantially parallel pair of wires, and the second, twisted pair of wires, run in straight lines parallel to each other.

5. The apparatus according to claim 1, wherein the first, substantially parallel pair of wires, and the second, twisted pair of wires, run in curved lines parallel to each other.

6. The apparatus according to claim 1, wherein the second, twisted pair of wires, comprises a plurality of loops and wherein the loops in the second, twisted wire pair have the substantially same length.

7. The apparatus according to claim 1, further comprising:
    a third, twisted pair of wires, substantially parallel to the first, substantially parallel wires, wherein the third twisted pair of wires is twisted in a different manner from the second, twisted pair of wires.

8. The apparatus according to claim 7, wherein the length of the wire loops are the same for both the second and third twisted pair of wires and the second and third twisted pair of wires have twists that are offset from each other by one half loop length.

9. The apparatus according to claim 7, wherein the length of wire loops of the third twisted pair of wires is an integer ratio of the length of the wire loops of the second twisted pair of wires.

10. The apparatus according to claim 7, further comprising:
    a fourth, twisted pair of wires, substantially parallel to the first, substantially parallel wires, wherein the fourth twisted pair of wires is twisted in a different manner from the second and third twisted pair of wires.

11. The apparatus according to claim 10, wherein the length of the wire loops are the same for both the second and third twisted pair of wires, the second and third twisted pair of wires have twists that are offset from each other by one half loop length, and the length of wire loops of the fourth twisted pair of wires is an integer ratio of the length of the wire loops of the second and third twisted pair of wires.

* * * * *